United States Patent
Hashimoto (10) Patent No.: US 10,063,245 B2
(45) Date of Patent: Aug. 28, 2018

(54) REFERENCE SIGNAL GENERATOR (71) Applicant: Furuno Electric Co., Ltd., Nishinomiya (JP)

(72) Inventor: Kunihiko Hashimoto, Neyagawa (JP)

(73) Assignee: Furuno Electric Co., Ltd., Nishinomiya (JP)

( * ) Notice: Subject to any disclaimer, the term of this patent is extended or adjusted under 35 U.S.C. 154(b) by 0 days.

(21) Appl. No.: 15/533,957

(22) PCT Filed: Nov. 10, 2015

(86) PCT No.: PCT/JP2015/081577
§ 371 (c)(1),
(2) Date: Jun. 7, 2017

(87) PCT Pub. No.: WO2016/093004
PCT Pub. Date: Jun. 16, 2016

(65) Prior Publication Data
US 2017/0338826 A1 Nov. 23, 2017

(30) Foreign Application Priority Data
Dec. 8, 2014 (JP) .................... 2014-247776

(51) Int. Cl.
*H03L 7/099* (2006.01)
*H03L 7/091* (2006.01)
*H04L 7/04* (2006.01)

(52) U.S. Cl.
CPC ............ *H03L 7/0992* (2013.01); *H03L 7/091* (2013.01); *H04L 7/04* (2013.01)

(58) Field of Classification Search
CPC .......... H03L 7/0992; H03L 7/091; H04L 7/04
(Continued)

(56) References Cited

U.S. PATENT DOCUMENTS 5,991,350 A  11/1999  Yamamoto
8,791,734 B1*  7/2014  Hara .................. H03L 7/146
                                                    327/156
(Continued)

FOREIGN PATENT DOCUMENTS

JP  H09238070 A  9/1997
JP  H11261415 A  9/1999
(Continued)

OTHER PUBLICATIONS

ISA Japan Patent Office, International Search Report Issued in Application No. PCT/JP2015/081577, dated Dec. 8, 2015, WIPO, 4 pages.

*Primary Examiner* — John Poos
(74) *Attorney, Agent, or Firm* — Alleman Hall Creasman & Tuttle LLP (57) ABSTRACT

In a reference signal generator including a synchronization circuit configured to convert a digital signal into an analog signal, supply this signal to a voltage controlled oscillator, and control the voltage controlled oscillator to obtain a signal synchronized with the reference signal, without an accumulation of quantization error in a holdover control in which an acquisition of a reference signal is not available. The reference signal generator includes a phase synchronization circuit and a controller. The phase synchronization circuit controls the reference signal outputted from the oscillator, according to a control signal obtained based on the reference signal. The controller generates a free-running control signal and controls the oscillator when the reference signal becomes unavailable. The oscillator receives discrete values and oscillates accordingly. A digital delta-sigma modulator configured to modulate the free-running control signal of the controller is disposed in a subsequent stage of the controller.

20 Claims, 9 Drawing Sheets (58) Field of Classification Search
USPC .......................................... 327/156, 158, 161
See application file for complete search history.

(56) References Cited

U.S. PATENT DOCUMENTS

| | | |
|---|---|---|
| 2005/0218997 A1 | 10/2005 | Xu |
| 2006/0202733 A1 | 9/2006 | Xu |
| 2010/0097150 A1* | 4/2010 | Ueda .................. H03L 7/089 |
| | | 331/25 |

FOREIGN PATENT DOCUMENTS

| | | |
|---|---|---|
| JP | H11271476 A | 10/1999 |
| JP | 2010161797 A | 7/2010 |
| JP | 2011040967 A | 2/2011 |

* cited by examiner

| HO TIME [SEC] | FREQUENCY ADJUSTMENT VALUE | PRESENT EMBODIMENT | | | CONVENTIONAL CONFIGURATION | | |
|---|---|---|---|---|---|---|---|
| | | DAC VALUE | QUANTIZATION ERROR | ACCUMULATED VALUE OF QUANTIZATION ERROR | DAC VALUE | QUANTIZATION ERROR | ACCUMULATED VALUE OF QUANTIZATION ERROR |
| 1 | 12.35 | 12 | 0.35 | 0.35 | 12 | 0.35 | 0.35 |
| 2 | 12.35 | 12 | 0.35 | 0.70 | 12 | 0.35 | 0.70 |
| 3 | 12.35 | 13 | -0.65 | 0.05 | 12 | 0.35 | 1.05 |
| 4 | 12.35 | 12 | 0.35 | 0.40 | 12 | 0.35 | 1.40 |
| 5 | 12.35 | 12 | 0.35 | 0.75 | 12 | 0.35 | 1.75 |
| 6 | 12.35 | 13 | -0.65 | 0.10 | 12 | 0.35 | 2.10 |
| 7 | 12.35 | 12 | 0.35 | 0.45 | 12 | 0.35 | 2.45 |
| 8 | 12.35 | 12 | 0.35 | 0.80 | 12 | 0.35 | 2.80 |
| 9 | 12.35 | 13 | -0.65 | 0.15 | 12 | 0.35 | 3.15 |
| 10 | 12.35 | 12 | 0.35 | 0.50 | 12 | 0.35 | 3.50 |

REFERENCE SIGNAL GENERATOR

TECHNICAL FIELD

This disclosure relates to a reference signal generator, which controls an oscillator to synchronize a reference signal with a reference signal.

BACKGROUND ART

For example, in base stations of mobile phones and transmitting stations of digital broadcasting, a highly accurate reference frequency signal (reference signal) required for synchronizing a timing and frequency of signal transmission is supplied using a reference frequency generator (reference signal generator). This type of reference frequency generators includes a reference frequency generator which controls a voltage controlled oscillator to synchronize an output signal with a highly accurate reference signal obtained from a GNSS receiver, and outputs the reference frequency signal.

This voltage controlled oscillator is configured to generate different frequencies according to an inputted control voltage. One example of such a voltage controlled oscillator is an analog type using a quartz crystal unit as a resonator.

With the above configuration, due to various causes such as a position of a GNSS satellite, an obstacle, an interfering radio wave, or any failure of a GNSS antenna, the GNSS receiver may fail to receive a signal from the GNSS satellite and generate the reference signal. Therefore, a reference frequency generator having a free-running control function for continuously outputting a reference frequency signal even when the reference signal can no longer be acquired is proposed. In a situation where the reference signal is successfully acquired, the reference frequency generator is capable of storing data which is used to control the voltage controlled oscillator. When the reference signal can no longer be obtained, the reference frequency generator performs a free-running control (holdover control) on the voltage controlled oscillator based on the stored data in the past, and thus a highly accurate reference frequency signal is successfully outputted for a long time.

Patent Document 1 discloses this type of reference signal generator, for example. The reference frequency generator of Patent Document 1 includes a PLL circuit using a digital filter with a long time constant and is configured to supply an analog DC voltage converted by a D/A converter, to a voltage control input terminal of a voltage controlled crystal oscillator. The reference frequency generator of Patent Document 1 is configured to be capable of controlling the voltage controlled oscillator when free-running, by correcting a frequency fluctuation due to a change with time.

REFERENCE DOCUMENT OF CONVENTIONAL ART

Patent Document

Patent Document 1: JPH11-271476A

DESCRIPTION OF THE DISCLOSURE

Problems to be Solved by the Disclosure

The configuration of Patent Document 1 is provided with the D/A converter, and is configured to control the voltage controlled oscillator by converting setting data into an analog DC voltage. However, when converting the digital signal into the analog signal by the D/A converter to control the oscillator as described above, a quantization error caused by the D/A converter cannot be ignored from being a factor of deteriorating a timing accuracy of the signal in the holdover control.

The quantization error of the D/A converter displaces the frequency of the voltage controlled oscillator. The timing accuracy of the signal in the holdover control is influenced by the displacement of the frequency, and this influence accumulates over time to increase the degree of deterioration. Therefore, in the case where the holdover control is performed for a long time, the quantization error becomes the cause of great deterioration of the timing accuracy of the signal.

This disclosure is made in view of the above situations and aims to solve the problem of an accumulation of quantization error in a holdover control in which an acquisition of a reference signal is not available, in a reference signal generator which includes a synchronization circuit configured to convert a digital signal into an analog signal, supply this signal to a voltage controlled oscillator, and control the voltage controlled oscillator to obtain a signal synchronized with the reference signal.

SUMMARY AND EFFECTS OF THE DISCLOSURE

The problems to be solved by the present disclosure are as described above, and a way to solve the problem and effects thereof are described next.

According to one aspect of the present disclosure, a reference signal generator having the following configuration may be provided. That is, this reference signal generator includes a synchronization circuit configured to control a reference signal outputted from an oscillator, according to a control signal obtained based on a reference signal, and a controller configured to generate a free-running control signal and control the oscillator when an acquisition of the reference signal becomes unavailable. The oscillator may be configured to receive discrete values and oscillate according to the discrete values. A digital modulator configured to modulate the free-running control signal of the controller may be disposed in a subsequent stage of the controller. The modulator may quantize input values at a resolution equal to a resolution of the oscillator, and output the discrete values to the oscillator such that an appearance ratio between a pair of the discrete values numerically adjacent to each other sandwiching the input value changes according to a value below a value indicating a quantization resolution.

With this configuration, under a situation where the acquisition of the reference signal becomes unavailable and thus a control (free-running control) on the oscillator is performed based on the free-running control signal, the modulator may cancel an accumulation of quantization error generated by outputting one of two discrete values, by outputting the other discrete value. Thus, since the accumulation of quantization error in the free-running control may be eliminated, timing accuracy of the signal may be maintained extremely favorably even when the free-running control is performed for a long time. As a result, the timing accuracy may be improved even by using the oscillator with a low resolution, thus the cost of the reference signal generator may effectively be reduced.

In the reference signal generator described above, the oscillator may include a D/A converter and an analog oscillator disposed in a subsequent stage of the D/A converter.

In this case, the timing accuracy may be improved even by using the D/A converter with a low resolution, thus the cost of the reference signal generator may effectively be reduced.

In the reference signal generator described above, the oscillator may include a digital oscillator.

In this case, the timing accuracy may be improved even by using the digital oscillator with a low resolution, thus the cost of the reference signal generator may effectively be reduced.

In the reference signal generator described above, the modulator may be a delta-sigma modulator.

Thus, the quantization may be performed while taking into consideration the accumulation of quantization error up to a previous quantization, therefore the accumulation of quantization error may stably remain around zero. As a result, the timing accuracy of the signal may be maintained favorably.

In the reference signal generator described above, a sampling cycle of the modulator may be equal to a control cycle of the oscillator.

In this case, a special configuration to change the sampling cycle may not be required, thus the configuration may be simplified.

In the reference signal generator described above, a sampling cycle of the modulator may be different from a control cycle of the oscillator.

In this case, more flexible processing may become available.

In the reference signal generator described above, the modulator may perform oversampling.

In this case, a large number of data may be acquired, thus more complicated processing may become available.

The reference signal generator described above may have the following configuration. That is, the modulator and the D/A converter may be disposed in the synchronization circuit. The synchronization circuit may include a digital loop filter disposed in a preceding stage of the modulator and configured to output the control signal to the modulator, and a filter disposed in a stage subsequent to the D/A converter and precedent to the oscillator.

Thus, an increase of phase noise of the frequency of the oscillator due to an influence of the quantization error by the D/A converter may be reduced favorably by being cut with the filter. Therefore, the phase noise may favorably be reduced even by using the D/A converter with a low resolution, thus the cost of the reference signal generator may effectively be reduced.

In the reference signal generator described above, the modulator may perform oversampling.

Thus, the increase of the phase noise of the frequency of the oscillator due to the influence of the quantization error by the D/A converter may significantly be reduced through being shifted to a higher frequency range by the oversampling of the modulator, and then being cut with, for example, a low-pass filter.

MODES FOR CARRYING OUT THE DISCLOSURE

Figure 1:
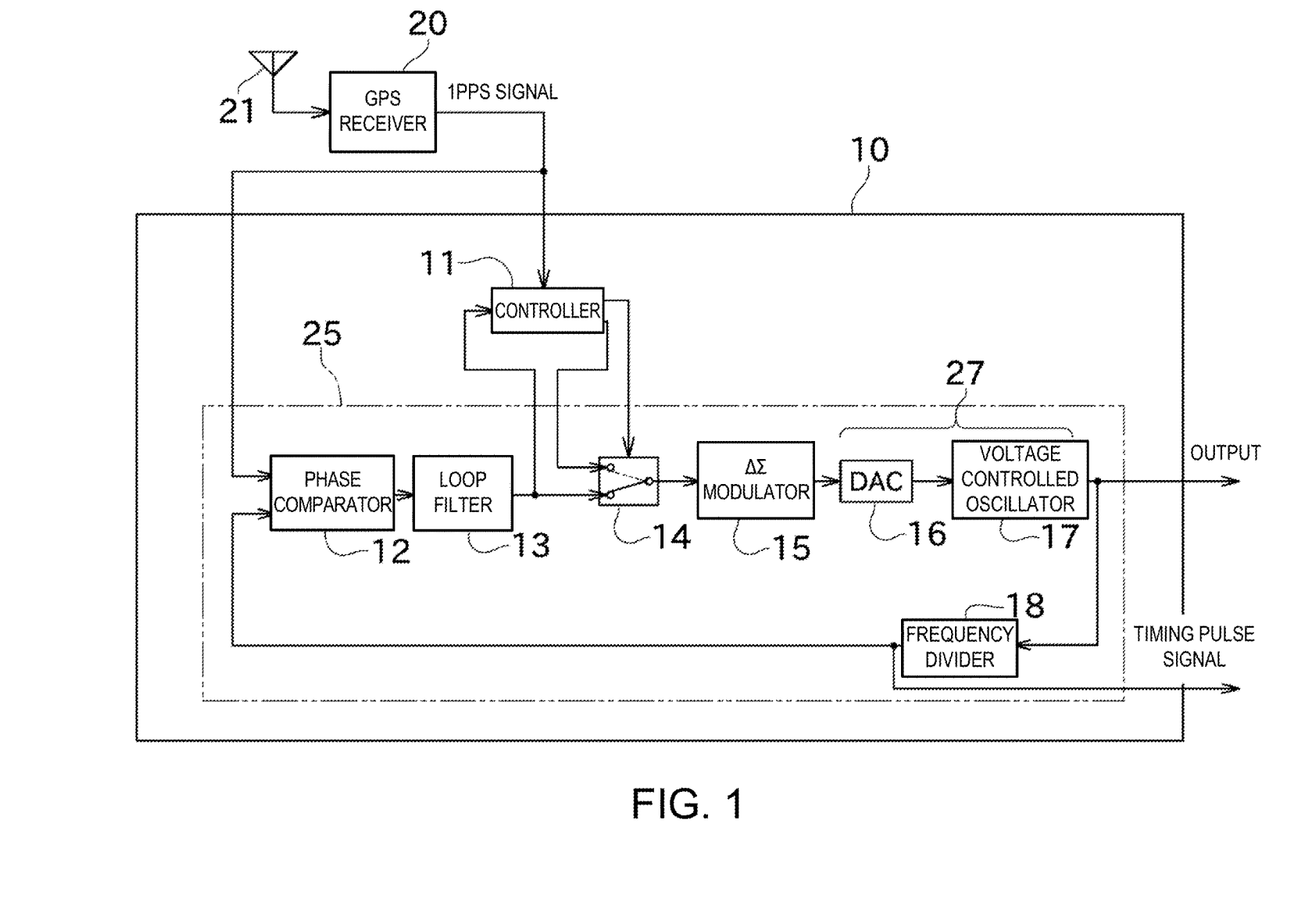
FIG. 1 is a block diagram illustrating a reference frequency generator according to a first embodiment of this disclosure.
Figure 2:
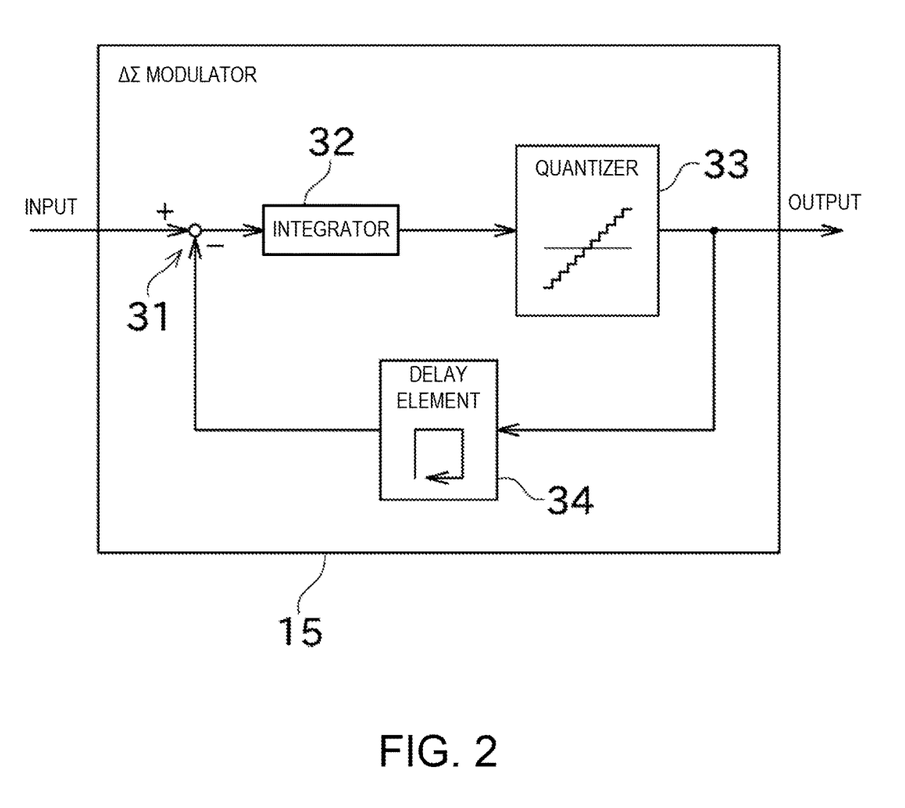
FIG. 2 is a block diagram illustrating a configuration of a delta-sigma modulator.

Next, embodiments of this disclosure are described with reference to the drawings. FIG. 1 is a block diagram illustrating a reference frequency generator 10 according to a first embodiment of this disclosure. FIG. 2 is a block diagram illustrating a configuration of a delta-sigma modulator 15.

The reference frequency generator (reference signal generator) 10 of the first embodiment of this disclosure may be used in a base station of mobile phones, a transmitting station of terrestrial digital broadcasting, and a WiMAX (Worldwide Interoperability for Microwave Access) communication facility, and may provide a reference frequency signal and a reference timing pulse to a user-side device connected thereto.

As illustrated in FIG. 1, the reference frequency generator 10 of the first embodiment may include a voltage controlled oscillator (oscillator) 17, a frequency divider 18, a phase comparator 12, a loop filter (phase difference signal converter) 13, a switch circuit 14, the delta-sigma modulator 15, a D/A converter 16, and a controller 11.

The reference frequency generator 10 may be connected to a GPS receiver comprised of a GPS receiver 20 and a GPS antenna 21, and this GPS receiver may supply a reference signal to the reference frequency generator 10. More specifically, the GPS receiver 20 may be configured to generate a 1PPS signal (Pulse-per-second signal) as the reference signal based of positioning signals included in radio waves received by the GPS antenna 21 from GPS satellites, and output it to the reference frequency generator 10. As illustrated in FIG. 1, the 1PPS signal generated by the GPS receiver 20 and supplied to the reference frequency generator 10 may be inputted to the controller 11 and the phase comparator 12.

The voltage controlled oscillator 17 may be a VCXO (Voltage Controlled Crystal Oscillator) which uses a quartz crystal unit as a resonator, and may be configured to be changeable of an output frequency according to an analog signal (specifically, voltage level) applied externally.

This voltage controlled oscillator 17 may output the reference frequency signal to an external user-side system and the frequency divider 18.

The voltage controlled oscillator 17 of this embodiment may be configured as a so-called OCXO (Oven Controlled Crystal Oscillator). Note that, the voltage controlled oscillator 17 may be configured as a different highly accurate oscillator, for example, a TCXO (Temperature Compensated Crystal Oscillator). Further, the voltage controlled oscillator 17 may be configured as an atomic oscillator instead of a crystal oscillator, for example.

The frequency divider 18 may be configured as a digital frequency divider, so as to divide the frequency of the reference frequency signal inputted from the voltage controlled oscillator 17, convert it from a high frequency to a low frequency to obtain a phase comparison signal, and output the obtained phase comparison signal to the phase comparator 12. For example, when the reference frequency outputted from the voltage controlled oscillator 17 is 10 MHz, the frequency divider 18 may divide the signal of 10 MHz outputted from the voltage controlled oscillator 17 at a frequency-division ratio of 1/10,000,000 and generate a 1 Hz phase comparison signal. The signal of the frequency divider 18 may be outputted from the reference frequency generator 10 as a timing pulse signal of 1PPS.

The phase comparator 12 may detect a phase difference between the 1PPS signal and the phase comparison signal of which frequency is divided by the frequency divider 18, and output a signal based on the phase difference (phase difference signal). The phase difference signal outputted from the phase comparator 12 may be inputted to the loop filter 13.

The loop filter 13 may average voltage levels of the phase difference signals with time and convert it into a control voltage signal (control signal). This control voltage signal may be inputted to the delta-sigma modulator 15 via the switch circuit 14.

The delta-sigma modulator 15 may delta-sigma modulate the control voltage signal inputted from the loop filter 13, and output the modulated control voltage signal to the D/A converter 16. Note that the configuration of the delta-sigma modulator 15 is described later in detail.

The D/A converter 16 may receive the control voltage signal which is a digital signal outputted from the delta-sigma modulator 15, and output an analog voltage corresponding to the control voltage signal to the voltage controlled oscillator 17. The voltage controlled oscillator 17 may output a signal with a frequency corresponding to the analog voltage. In this embodiment, the D/A converter 16 and the voltage controlled oscillator 17 may constitute an oscillator 27 configured to receive discrete values and oscillate according to the discrete values.

By the above PLL loop, the output frequency of the voltage controlled oscillator 17 may suitably be adjusted so that the phase of the phase comparison signal coincides with the phase of the 1PPS signal. The control voltage signal from the loop filter 13 may also be transmitted to the controller 11, and the controller 11 may store this control voltage signal in chronological order.

The controller 11 may control various parts of the reference frequency generator 10, and may be configured as a microcomputer comprised of a CPU as a computing unit and a memory as a storing unit. With this configuration, the controller 11 may monitor whether the 1PPS signal is supplied from the GPS receiver 20. If the 1PPS signal is determined as supplied, the controller 11 may transmit a switch control signal to the switch circuit 14 so as to connect the loop filter 13 with the voltage controlled oscillator 17 via the delta-sigma modulator 15 and the D/A converter 16.

The switch circuit 14 may output the signal of the loop filter 13 to the voltage controlled oscillator 17 via the delta-sigma modulator 15 and the D/A converter 16. Thus, a loop of a phase synchronization circuit (Phase Locked Loop, PLL circuit, synchronization circuit) 25 may be formed to control the voltage controlled oscillator 17 so as to synchronize the reference frequency signal with the 1PPS signal which is the reference signal. Note that in the following description, the state where the reference frequency generator 10 successfully acquires the 1PPS signal and the reference frequency signal is outputted based thereon as described above may be referred to as "steady state."

Next, a control performed when the GPS receiver 20 cannot receive the signals from the GPS satellites and no longer generate the 1PPS signal is described. When the loss of the 1PPS signal is detected, the controller 11 may transmit the switch control signal to the switch circuit 14 to connect the controller 11 with the voltage controlled oscillator 17, and perform a holdover control (free-running control). In this holdover control, the switch circuit 14 may be switched so that instead of the control voltage signal outputted from the loop filter 13, a free-running control signal generated by the controller 11 is outputted to the voltage controlled oscillator 17 via the delta-sigma modulator 15 and the D/A converter 16. "The loss of signal" may mean both of a phenomenon in which the pulse of the 1PPS signal is fixed to one of Hi and Low sides and a phenomenon in which a signal is continuously outputted at inaccurate timings of 1PPS.

As described above, the control voltage signal outputted from the loop filter 13 may be inputted to the controller 11. In the state where the 1PPS signal is obtained from the GPS receiver 20 (the steady state), the controller 11 may be configured to repeatedly acquire the value of the control voltage signal outputted from the loop filter 13 to the voltage controlled oscillator 17 at a given time interval, and store them in chronological order.

Note that an oscillation frequency-control voltage characteristic (hereinafter, referred to as "the F-V characteristic") of the voltage controlled oscillator 17 may slightly change over time. In consideration of this, the controller 11 may estimate the change of the F-V characteristic of the voltage controlled oscillator 17 over time, based on values of a series of control voltage signals stored in chronological order as described above. Therefore, it may be said that the steady state is a state where the reference frequency generator 10 learns the change of the voltage controlled oscillator 17 over time. This estimation result may be used in determining the value of the free-running control signal to be supplied to the voltage controlled oscillator 17 when the supply of the 1PPS signal is lost.

Next, the delta-sigma modulator 15 is described with reference to FIG. 2. The delta-sigma modulator 15 may quantize the input values at a resolution equal to a resolution of the D/A converter 16 and, output discrete values such that an appearance ratio between a pair of the discrete values numerically adjacent to each other sandwiching the input value changes according to a value below the value indicating a quantization resolution.

The delta-sigma modulator 15 may include a subtractor 31, an integrator 32, a quantizer 33, and a delay element 34. Note that the delta-sigma modulator 15 may be a digital delta-sigma modulator 15, and each of the subtractor 31, the integrator 32, the quantizer 33, and the delay element 34 may be constituted by a digital circuit.

The subtractor 31 may receive the signal (control voltage signal) inputted from the switch circuit 14 and the output of the quantizer 33 obtained in a previous clock cycle and stored by the delay element 34, and the subtractor 31 may calculate a difference between the signal and the output and output the difference to the integrator 32. Therefore, the value outputted to the integrator 32 may include a quantization error of the quantizer 33.

The integrator 32 may integrate the outputs of the subtractor 31. Thus, the quantization error is successively added (accumulated) in the integrator 32. The integrator 32 may output the integrated value to the quantizer 33.

The quantizer 33 may be configured as a digital multi-level quantizer, and the quantization bit number of the quantizer 33 may be set the same as that of the D/A converter 16. The quantizer 33 may quantize the input signal to a discrete value and output the quantized value to the D/A converter 16. The quantized value may be stored in the delay element 34.

When the delta-sigma modulator 15 configured as described above quantizes the input by the quantizer 33, the quantization may be performed while an error occurred in a previous quantization (an accumulation of error by the previous quantization) remains, and the result thereof may be outputted. Therefore, the quantization error of the control signal to be supplied to the voltage controlled oscillator 17 through the D/A converter 16 may be reduced to an extremely small value.

Note that, in the steady state where the 1PPS signal is inputted to the reference frequency generator 10, even if the quantization error in the D/A converter 16 accumulates to some extent, since the loop filter 13 may control the voltage controlled oscillator 17 to cancel the displacement of the frequency caused by the quantization error and synchronize the signal with the 1PPS, substantially no problem arises. Therefore, the delta-sigma modulator 15 described above may be effective especially in a situation where the reference frequency generator 10 loses the supply of 1PPS signal and the holdover control is required to be performed for a long time.

Hereinafter, effects of the delta-sigma modulator 15 of this embodiment are described in detail.

First, about how high the accumulated value of the quantization error may reach in each of this embodiment and a reference signal generator having a conventional configuration which is not provided with the delta-sigma modulator 15 is described based on calculation. Here, a case where the holdover control is continuously performed for 24 hours in the reference frequency generator adopting an OCXO with a frequency variation width of 1000 ppb is considered as an example.

The description is given for cases where a resolution of the D/A converter configured to output the voltage to the OCXO is 16 bits and 12 bits, respectively. In the case of 16 bits, the quantization resolution may be 1000 [ppb]/$2^{16}$=0.015 [ppb/LSB]. In the case of 12 bits, the result may become 0.244 [ppb/LSB] in the same calculation manner.

The highest value of the quantization error may be a half of the quantization resolution. Therefore, when a timing error of the signal in a case where the worst quantization error continuously occurs for 24 hours is obtained, the timing error when the D/A converter 16 is 16 bits may be calculated through multiplying 86,400 seconds which is the number of seconds in 24 hours, by the half of the quantization resolution described above. The result may become 0.66 [μsec]. In the case of 12 bits, the timing error may become 10.55 [μsec] in the same calculation manner.

Thus, when using the inexpensive 12-bit D/A converter, a timing error of ±10 μsec or less per 24 hours which is a criterion of the timing error during the holdover control, cannot be satisfied. Note that the above criterion means that ±10 μsec or less, which is the timing accuracy required by the CDMA communication standard, is successfully maintained even after 24 hours, considering that maintenance work (e.g., replacing the GPS antenna) of the reference frequency generator takes a certain period of time.

In the Time Division Duplex (TDD) method of the LTE which is a communication standard which is faster than the communication standard (3G) of so-called third generation mobile phones, the timing accuracy at which the frequency error of the output signal is ±1.5 μsec or less is required. Therefore, when the reference frequency signal is supplied to such a communication facility, even when the highly accurate 16-bit D/A converter is used, the accumulation of the quantization error (0.66 μsec in 24 hours) requires attention. Moreover, due to a change of the communication method in the future, there is a possibility that the timing accuracy required for the reference frequency generator 10 will become more strict.

On the other hand, in this embodiment using the delta-sigma modulator 15, the accumulated value of the quantization error may not exceed the quantization resolution, for which detail is described later. Therefore, even when the holdover control is performed for 24 hours, the timing error may become 0.015 [nsec] when the 16-bit D/A converter 16 is used, and 0.244 [nsec] when the 12-bit D/A converter 16 is used. Thus, at least 1000 times higher accuracy may be obtained, which may indicate a definite effect of this disclosure.

Next, how the accumulated value of the quantization error changes during the holdover control in this embodiment and the conventional configuration is described based on calculation.

Figure 3:
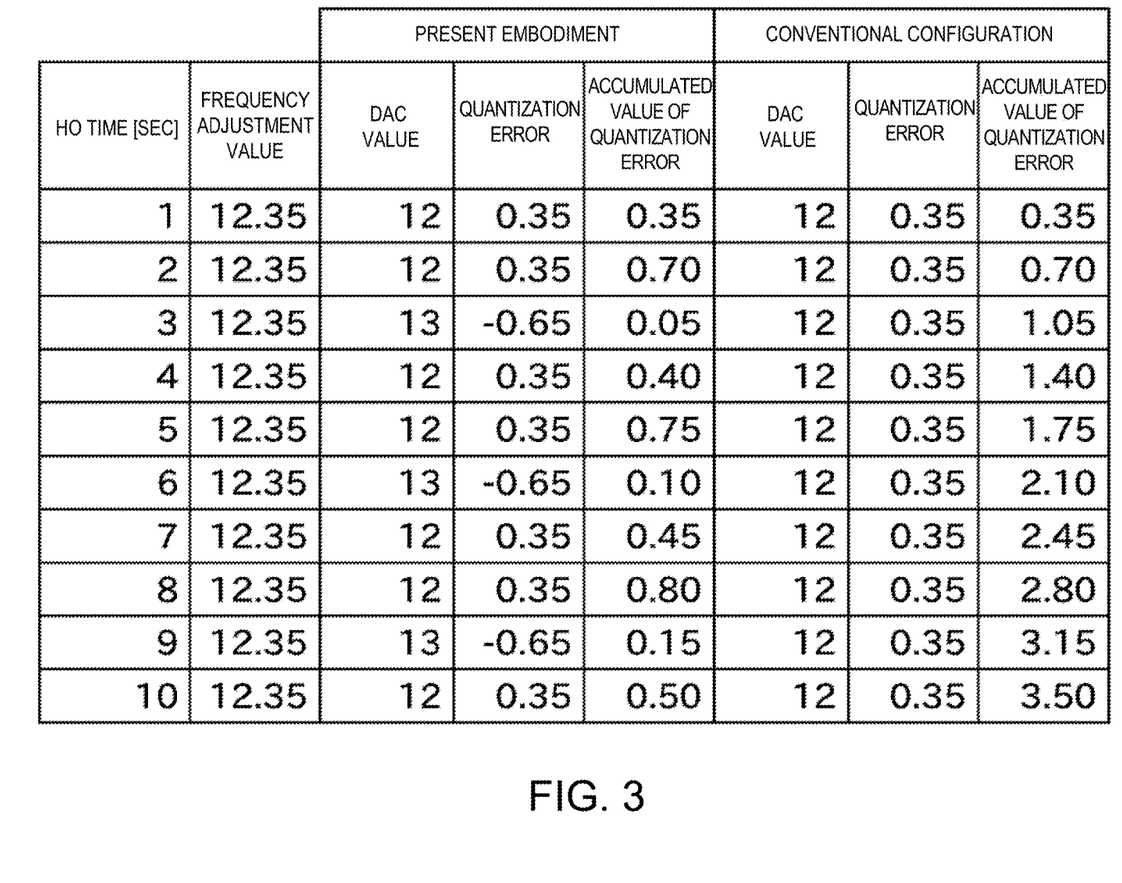
FIG. 3 is a table illustrating changes of an accumulated value of quantization error during a holdover control in this embodiment and a conventional configuration, in comparison with each other.

Here, a frequency adjustment value which should be supplied from the controller 11 to the voltage controlled oscillator 17 when the reference frequency generator 10 loses the supply of the 1PPS signal and performs the holdover control may be assumed to be 12.35, and the D/A converter 16 may be assumed to have a resolution of only the integer part. For this case, FIG. 3 illustrates the frequency adjustment value (DAC value), the quantization error, and the quantization error accumulated value supplied to the D/A converter 16 of each of the reference frequency generator 10 of this embodiment including the delta-sigma modulator 15, and of the conventional configuration. Note that, "HO TIME" in FIG. 3 indicates elapsed time (duration of the holdover control) from a started timing of the holdover. Further, a sampling frequency of the delta-sigma modulator 15 may be 1 Hz.

As illustrated in FIG. 3, with the conventional configuration, only one kind of discrete value (12) is outputted as the frequency adjustment value supplied to the D/A converter, and thus, the accumulated value of the quantization error may increase linearly by 0.35. On the other hand, when the delta-sigma modulation is used as in this embodiment, a pair of the discrete values (12 and 13) adjacent to each other sandwiching the input value: 12.35, may be outputted while suitably switching therebetween. The frequency at which these two discrete values appear as the output value may be determined according to a value (0.35) which is below the value indicating the quantization resolution.

Furthermore, the delta-sigma modulator 15 may perform the quantization while taking into consideration the accumulation of quantization error up to the previous quantization. As a result, a fluctuation range of the accumulated value of the quantization error may remain within a range not exceeding 1 which is a quantization unit (LSB).

Figure 4:
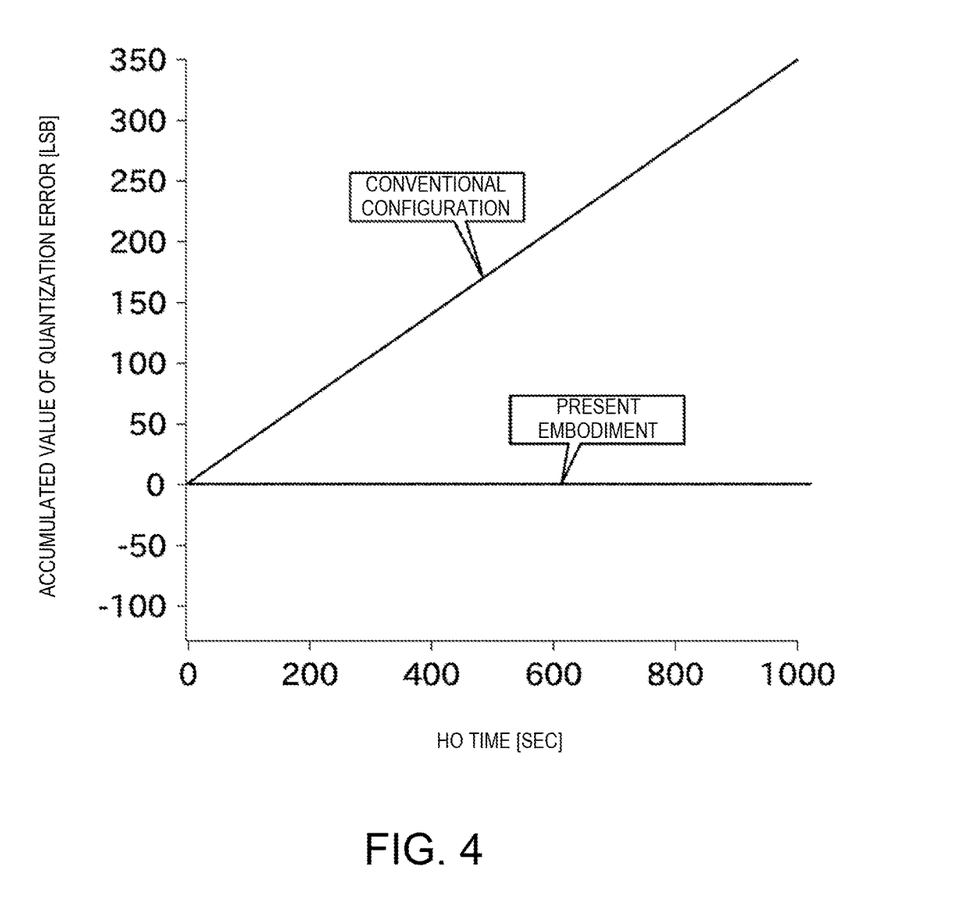
FIG. 4 is a chart illustrating changes of the accumulated value of quantization error when a frequency adjustment value is constant during the holdover control.

Note that, the chart of FIG. 4 illustrates the changes of the quantization error accumulated value for 1000 seconds from the start of the holdover control, in this embodiment and the conventional configuration. As it may be understood from this chart, the configuration of this embodiment may reduce the quantization error extremely favorably. Therefore, the reference frequency generator 10 of this embodiment may significantly improve the timing accuracy of the output signal in the holdover control (i.e., the timing accuracy of the reference frequency signal and the timing pulse signal outputted from the reference frequency generator 10).

Note that the calculation results of FIGS. 3 and 4 indicate a case where the frequency adjustment value which should be supplied to the voltage controlled oscillator 17 is fixed. On the other hand, as described above, during the holdover control, since the free-running control signal is subjected to a correction based on the change of the F-V characteristic of the voltage controlled oscillator 17 over time and a correction based on a temperature of the voltage controlled oscillator 17, the control signal may change. With this in consideration, a case may be considered in which the frequency adjustment value which should be supplied to the voltage controlled oscillator 17 by the controller 11 is 12.35 at the started timing of the holdover control and it linearly increases to 13.35 after 1000 seconds.

Figure 5:
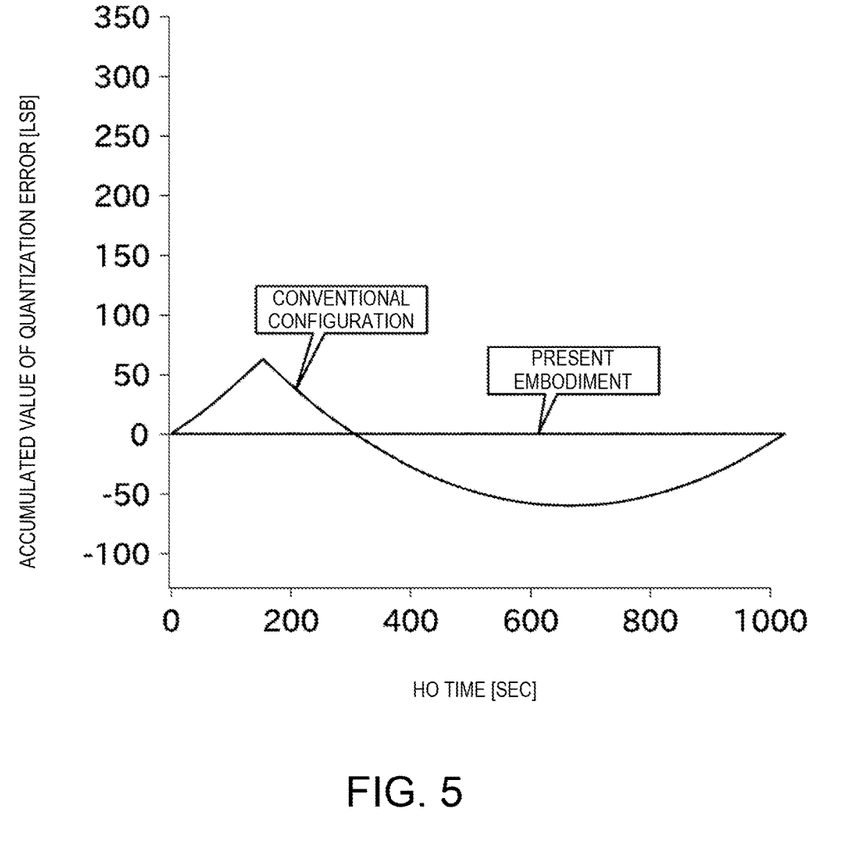
FIG. 5 is a chart illustrating changes of the accumulated value of quantization error when the frequency adjustment value linearly increases during the holdover control.

The calculation result of this case is illustrated in the chart of FIG. 5. As it may be understood from FIG. 5, the accumulated quantization error value increases or decreases as a quadratic function with respect to the duration of the holdover control, which is because the frequency adjustment value may increase as a linear function.

In the case of FIG. 5, the frequency adjustment value which should be supplied to the voltage controlled oscillator 17 changes beyond the resolution of the D/A converter 16. Thus, the quantization error may fluctuate between positive and negative values. As a result, the accumulated value of the quantization error with the conventional configuration is smaller than the case of FIG. 4 and fluctuates within a certain range centering on zero.

If the quantization error is uniformly spread around zero (e.g., continuous uniform distribution), the accumulated value of the quantization error may be zero even with the conventional configuration. However, even when the frequency adjustment value is sufficiently larger than the quantization unit, it usually takes long time to achieve the uniform spread as described above. Therefore, in the conventional configuration, even if the quantization error is uniformly spread by the holdover control performed for a long period of time, before entering such a situation, the accumulated error may become considerably large and a time period in which the timing accuracy of the output signal considerably deteriorates may occur.

On the other hand, according to this embodiment, similar to the case of FIG. 4, the fluctuation range of the accumulated value of the quantization error may fall within the range not exceeding 1 which is the quantization unit (LSB). Therefore, in this embodiment, the timing accuracy of the output signal in the holdover control may be maintained extremely favorably over a long period of time.

Note that, in view of improving the timing accuracy, since the accumulated value of the quantization error within the holdover time is sufficient to be set to zero, setting the sampling cycle of the delta-sigma modulator 15 to once per second, which is the same as the control cycle of the voltage controlled oscillator 17, may be sufficient. In other words, oversampling which is often performed by the delta-sigma modulator 15 may be unnecessary, and the quantization error may simply be accumulated in the next sampling. Furthermore, even if the sampling cycle of the delta-sigma modulator 15 is set longer than the control cycle of the oscillator 27, the effect of reducing the accumulation of quantization error during the holdover may sufficiently be exerted.

As described above, the reference frequency generator 10 of this embodiment may include the phase synchronization circuit 25 and the controller 11. The phase synchronization circuit 25 may control the reference signal outputted by the oscillator 27, according to the control signal obtained based on the reference signal. When the acquisition of the reference signal becomes unavailable, the controller 11 may generate the free-running control signal and control the oscillator 27. The oscillator 27 may be configured to oscillate according to the inputted discrete values. The digital delta-sigma modulator 15 configured to modulate the free-running control signal of the controller 11 may be disposed in a subsequent stage of the controller 11. The delta-sigma modulator 15 may quantize the input values at the resolution equal to the resolution of the oscillator 27 (the resolution of the D/A converter 16), and output the discrete values such that the appearance ratio between a pair of the discrete values numerically adjacent to each other sandwiching the input value changes according to the value below the value indicating the quantization resolution.

Therefore, under the situation where the holdover control is performed, the delta-sigma modulator 15 may cancel the accumulation of quantization error generated by outputting one of the two discrete values, by outputting the other discrete value. Thus, since the accumulation of quantization error in the holdover control may be eliminated, the timing accuracy of the signal may be maintained extremely favorably even when the holdover control is performed for a long time. As a result, the timing accuracy may be improved even by using the low-resolution oscillator 27, thus the cost of the reference frequency generator 10 may effectively be reduced.

Figure 6:
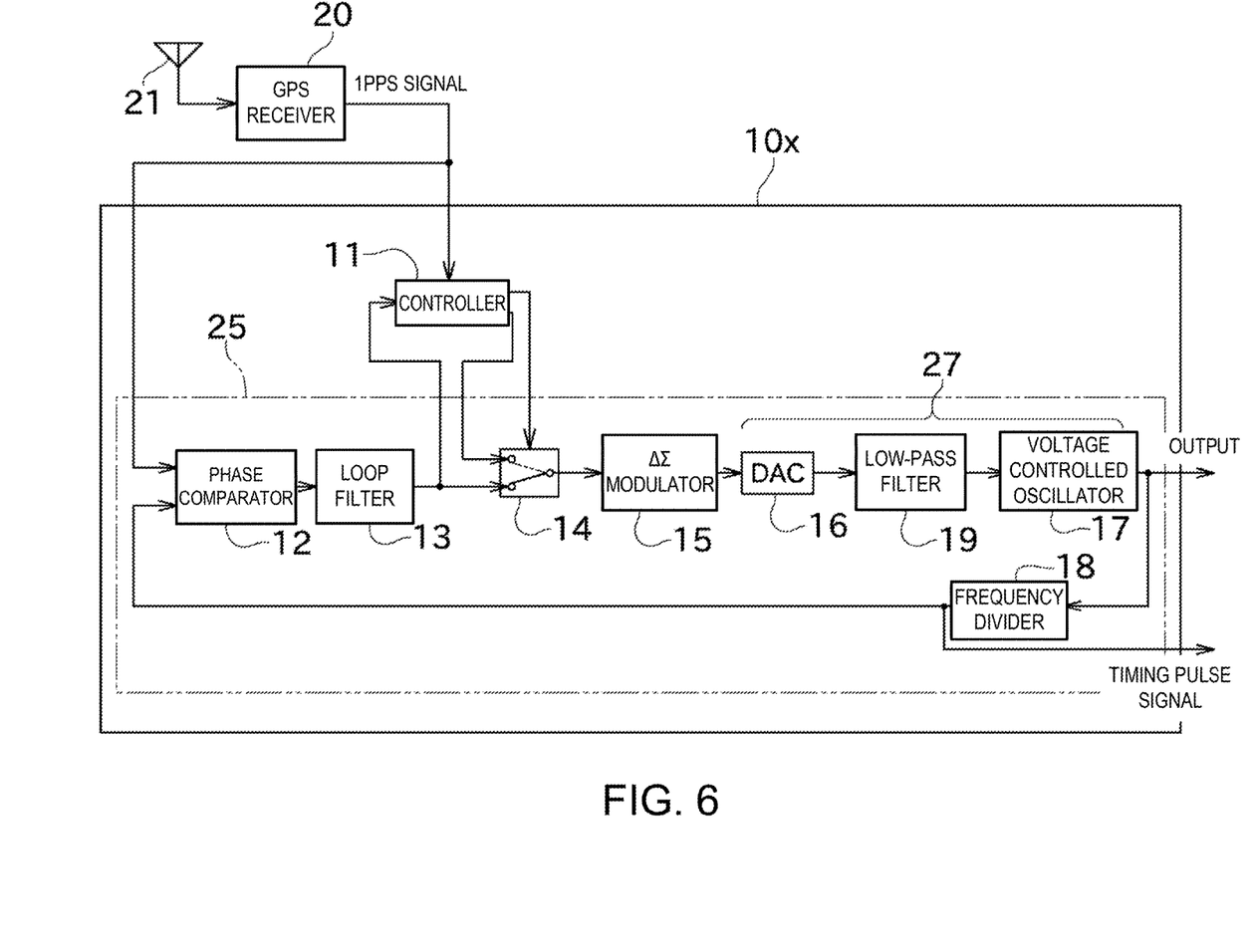
FIG. 6 is a block diagram illustrating a reference frequency generator according to a second embodiment.

Next, a second embodiment is described. FIG. 6 is a block diagram illustrating a reference frequency generator 10x of the second embodiment. Note that, in the description of this embodiment, the same or similar members as those in the above embodiment are denoted with the same reference characters, and the description thereof may be omitted.

That is, in the Patent Document 1 described above, the configuration in which the digital PLL circuit is adopted and the voltage controlled crystal oscillator is controlled via the D/A converter is applied. However, in this configuration, phase noise of the oscillator increases due to the influence of the quantization error by the D/A converter. Especially when the D/A converter being used has a low resolution, since the phase noise greatly increases, a high-resolution D/A converter needs to be used to avoid this increase, which causes a difficulty in cost reduction of the device.

The reference frequency generator 10x of the second embodiment is intended to solve the above problem. For example, in the phase synchronization circuit 25 of the reference frequency generator 10x, a low-pass filter (filter) 19 may be disposed in a stage subsequent to the D/A converter 16 and precedent to the voltage controlled oscillator 17.

With the configuration of this embodiment, (similarly to the first embodiment described above) in the phase synchronization circuit 25 which is a digital PLL circuit, the delta-sigma modulator 15 may modulate the control voltage signal outputted from the loop filter 13. In this embodiment, oversampling may be performed by the delta-sigma modulator 15.

Generally, when oversampling is performed by a delta-sigma modulator, a transfer function with respect to the quantization error is known to be small within a low frequency range, and large within a high frequency range. Therefore, quantization noise components of the output signal of the delta-sigma modulator 15 are biased toward the high frequency range. Thus, the increasing range of the phase noise moves to the high frequency range.

In the reference frequency generator 10x of this embodiment, the noise-increasing range moved to the high frequency range as described above may be subjected to reduction of such noise by the low-pass filter 19 in combination with the delta-sigma modulator 15. Thus, the phase noise may favorably be reduced from the digital PLL circuit when the voltage controlled oscillator 17 is controlled via the D/A converter 16.

Note that, in the second embodiment, the frequency of oversampling performed by the delta-sigma modulator 15 may further be increased so as to move the increasing range of the phase noise to a higher frequency range.

Next, two experiments conducted by the present inventors on the phase noise reduction effect of this embodiment are described.

The first experiment is described. That is, the present inventors checked the change of the phase noise caused by the resolution of the D/A converter with the conventional configuration (i.e., a configuration corresponding to FIG. 6 without the delta-sigma modulator 15 and the low-pass filter 19). For example, in a state where the phase synchronization circuit is locked to the 1PPS signal which is the reference signal (the steady state described above), the phase noise was measured in both cases where the resolution of the D/A converter is 16 bits and 12 bits.

Figure 7:
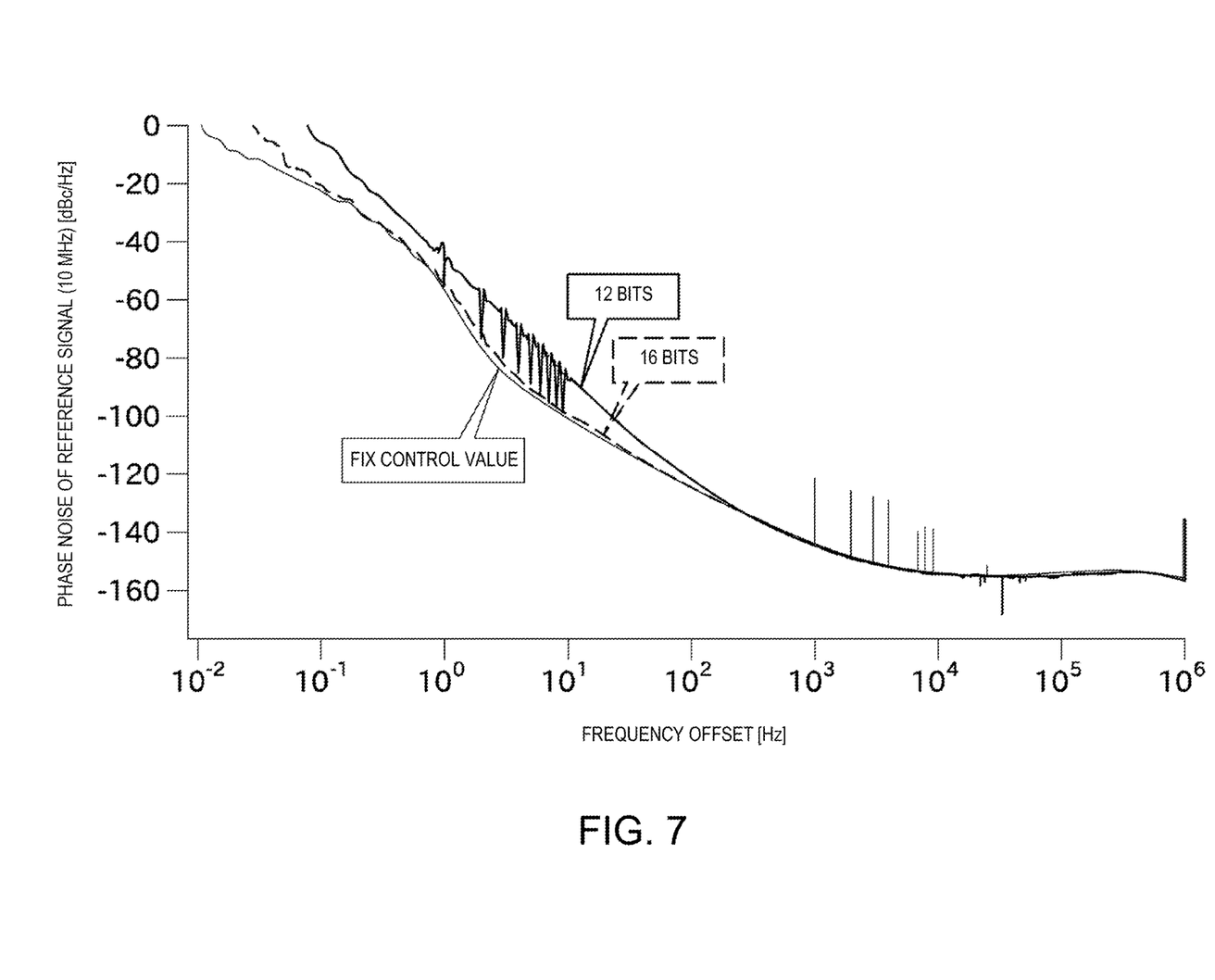
FIG. 7 is a chart illustrating phase noise when 16-bit and 12-bit D/A converters are used with the conventional configuration, respectively.

The results thereof are illustrated in FIG. 7. In the charts of FIG. 7 and subsequent drawings, the phase noise when the value (control value) supplied to the D/A converter is fixed is illustrated together. Fixing the value supplied to the D/A converter as described above may be preferable as a comparison target for examining the phase noise, since the characteristic of the voltage controlled oscillator may be considered to appear as it is.

Referring to the chart of FIG. 7, the phase noise is relatively small when the resolution of the D/A converter is 16 bits, whereas in the case of 12 bits, larger phase noise is observed in a low frequency band (up to $10^2$ Hz). Thus, it is understood that the increase of phase noise in the low frequency band becomes larger when the resolution of the D/A converter is low.

The second experiment is described. That is, the present inventors measured phase noise with a configuration provided with only the delta-sigma modulator 15 (i.e., a configuration corresponding to FIG. 6 without the low-pass filer 19), for a case where the delta-sigma modulator 15 does not perform oversampling (sampling at 1 Hz), a case where the delta-sigma modulator 15 performs oversampling at 100 Hz, and a case where the delta-sigma modulator 15 performs oversampling at 1000 Hz, while the resolution of the D/A converter is fixed to 12 bits.

Figure 8:
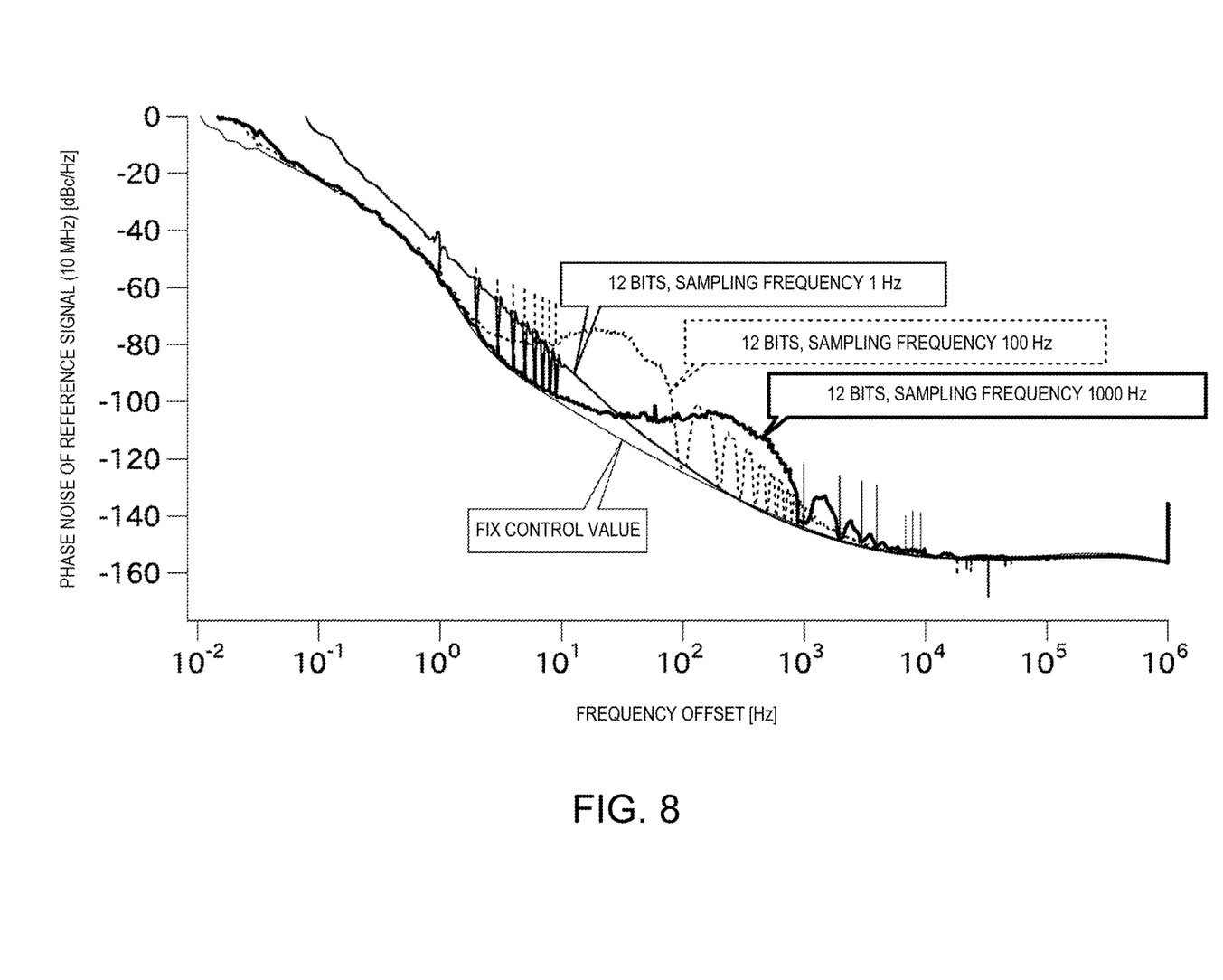
FIG. 8 is a chart illustrating phase noise when a sampling frequency of the delta-sigma modulator is changed by using the 12-bit D/A converter.

The results thereof are illustrated in FIG. 8. According to FIG. 8, it is understood that as the oversampling frequency is increased to 100 Hz and 1000 Hz, the phase noise is reduced within the low frequency band with the frequency offset, whereas the phase noise increases within the high frequency range.

Figure 9:
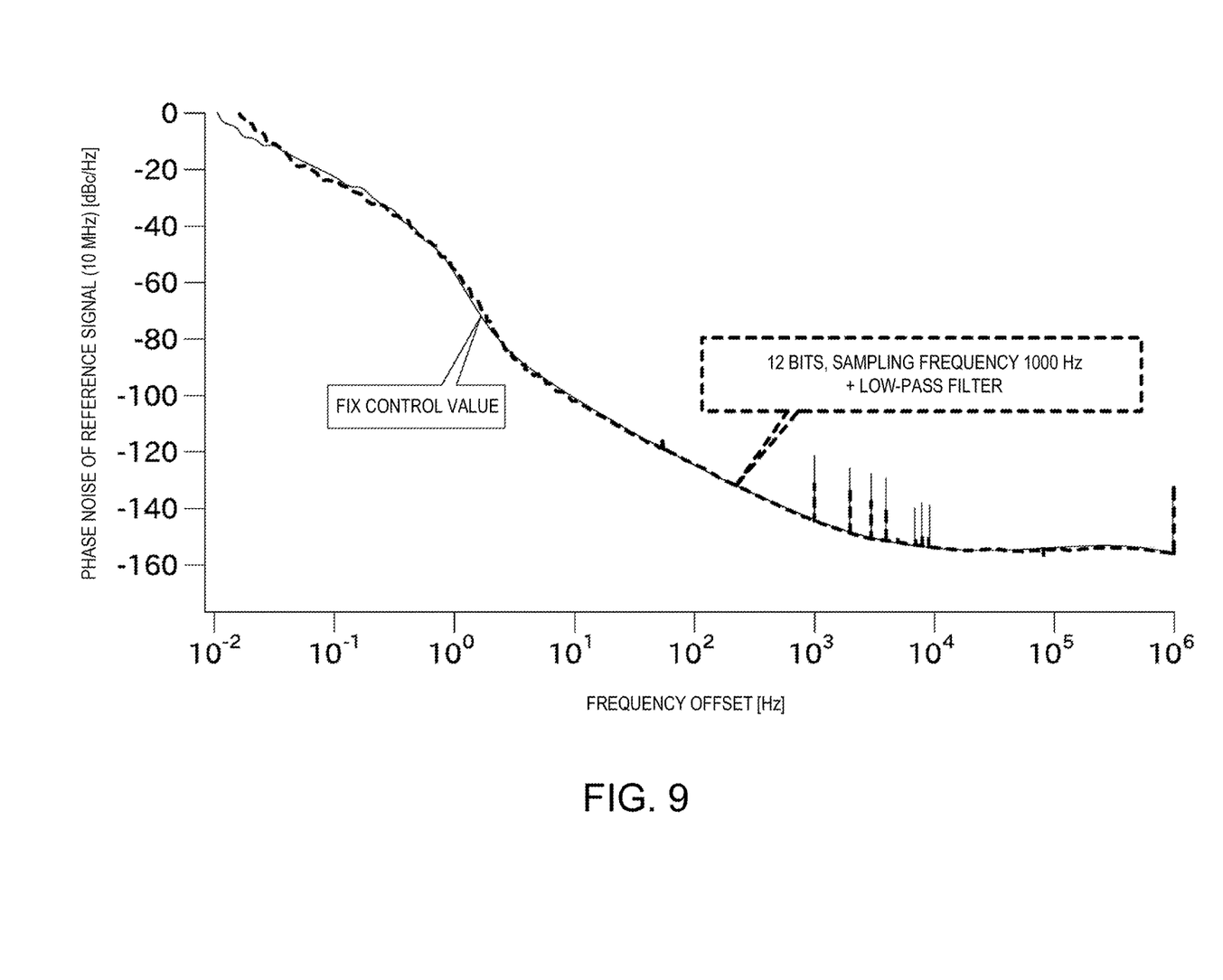
FIG. 9 is a chart illustrating phase noise in a configuration in which oversampling by the delta-sigma modulator is combined with a low-pass filter by using the 12-bit D/A converter.

Note that FIG. 9 illustrates a measurement result of the phase noise when the low-pass filter 19 is provided in addition to the delta-sigma modulator 15, and the oversampling is performed by the delta-sigma modulator 15 at 1000 Hz.

As illustrated in FIG. 9, it is understood that the combination of the delta-sigma modulator 15 and the low-pass filter 19 greatly improved the phase noise and brought it closer to the characteristic of the voltage controlled oscillator itself.

Note that, depending on the usage etc. of the reference frequency generator, a reduction of phase noise within a specific frequency range (e.g., the range of 10 Hz to 100 Hz illustrated in FIG. 7) may be required. In this case, since it may be sufficient to only provide the low-pass filter 19 (may be a band-pass filter), the delta-sigma modulator 15 may be configured not to perform oversampling. Further, when reducing low frequency phase noise, the time constant of the low-pass filter is necessarily increased; however, the increase amount is limited. Therefore, in such a case, the delta-sigma modulator 15 may perform the oversampling so as to shift the increase of the phase noise within the low frequency range to the high frequency range.

As described above, in this embodiment, the phase noise characteristic may flexibly be controlled by the combination of the sampling frequency of the delta-sigma modulator 15 and a passband of the low-pass filter 19 (or a band-pass filter), and it may be said that a great technical significance exists in this regard.

Although the preferred embodiments of this disclosure are described above, the above configurations may be modified as follows, for example.

The modulator configured to modulate the free-running control signal from the controller 11 is not limited to the delta-sigma modulator 15 described in the above embodiments. For example, if the resolution of the D/A converter 16 is 1 and the frequency adjustment value (input to the modulator) which should be supplied to the voltage controlled oscillator 17 is 12.35, a modulator which generates and outputs, for example, 12, 12, 13, 12, 12, 13, . . . , which is a sequence of numbers comprised of two discrete values with the probability of outputting 12 being 65% and the probability of outputting 13 being 35% may be adopted.

The delta-sigma modulator 15 may not be included in the phase synchronization circuit 25, and may be disposed between the controller 11 and the switch circuit 14, for example. A D/A converter disposed in the synchronization circuit to convert the signal received from the loop filter 13, and a D/A converter configured to convert the signal from the controller 11 may separately be provided.

In the above embodiments, the oscillator 27 may include the D/A converter 16 and the analog voltage controlled oscillator 17 disposed in the subsequent stage thereof. However, the oscillator may alternatively be configured as an oscillator of digital input. That is, this disclosure may also be applied to a digital oscillator by supplying through delta-sigma modulation, input values at a resolution equal to or lower than a bit resolution of the digital input.

As described above, the reference signals outputted by the reference frequency generators 10 and 10x are not limited to the frequency signal of 10 MHz and the timing pulse signal of 1PPS, and may be changed to output signals in various other formats.

DESCRIPTION OF REFERENCE CHARACTERS 10, 10x Reference frequency generator (Reference signal generator)

11 Controller
13 Loop Filter
15 Delta-sigma Modulator (Modulator)
16 D/A Converter
17 Voltage Controlled Oscillator (Analog Oscillator)
19 Low-pass Filter
25 Phase Synchronization Circuit (Synchronization Circuit)
27 Oscillator

The invention claimed is:

1. A reference signal generator, comprising:
an oscillator configured to receive discrete values and to oscillate according to the discrete values, and
synchronization circuitry configured:
to control a reference signal outputted from the oscillator, according to a control signal obtained based on a reference signal,
to generate a holdover control signal, and
to control the oscillator when an acquisition of the reference signal becomes unavailable, wherein,
the synchronization circuitry further configured:
to modulate the holdover control signal,
to quantize input values at a resolution equal to a resolution of the oscillator, and
to output the discrete values by changing an appearance ratio between a pair of the discrete values numerically adjacent to each other sandwiching the input value according to a value below a value indicating a quantization resolution.

2. The reference signal generator of claim 1, wherein the oscillator includes a D/A converter and an analog oscillator disposed in a subsequent stage of the D/A converter.

3. The reference signal generator of claim 1, wherein the oscillator includes a digital oscillator.

4. The reference signal generator of claim 1, wherein the synchronization circuitry is further configured to modulate the holdover control signal with a delta-sigma principle.

5. The reference signal generator of claim 1, wherein a sampling cycle for the synchronization circuitry to modulate is equal to a control cycle of the oscillator.

6. The reference signal generator of claim 1, wherein a sampling cycle for the synchronization circuitry to modulate by oversampling is different from a control cycle of the oscillator.

7. The reference signal generator of claim 2, wherein, the synchronization circuit is further configured:
to divide the reference signal outputted from the oscillator, to generate a phase comparison signal, and to output the phase comparison signal,
to detect a phase difference between the reference signal and the phase comparison signal, to generate a phase difference signal, and to output the phase difference signal,
to average the phase difference signal and to output the control signal, and
to modulate the holdover control signal according to the control signal.

8. The reference signal generator of claim 7, wherein the synchronization circuit further configured
to filter the phase noise in a stage subsequent to the D/A converter and precedent to the oscillator.

9. The reference signal generator of claim 2, wherein the synchronization circuitry further configured to modulate the holdover control signal with a delta-sigma principle.

10. The reference signal generator of claim 9, wherein, the synchronization circuit is further configured:
to divide the reference signal outputted from the oscillator, to generate a phase comparison signal, and to output the phase comparison signal,
to detect a phase difference between the reference signal and the phase comparison signal, to generate a phase difference signal, and to output the phase difference signal,
to average the phase difference signal and to output the control signal,
to modulate the holdover control signal according to the control signal.

11. The reference signal generator of claim 10, wherein, the synchronization circuit is further configured
to filter the phase noise in a stage subsequent to the D/A converter and precedent to the oscillator.

12. The reference signal generator of claim 9, wherein a sampling cycle for the synchronization circuitry to modulate by oversampling is different from a control cycle of the oscillator.

13. The reference signal generator of claim 12, wherein, the synchronization circuit is further configured:
to divide the reference signal outputted from the oscillator, to generate a phase comparison signal, and to output the phase comparison signal,
to detect a phase difference between the reference signal and the phase comparison signal, to generate a phase difference signal, and to output the phase difference signal,
to average the phase difference signal and to output the control signal, and
to modulate the holdover control signal according to the control signal.

14. The reference signal generator of claim 13, wherein, the synchronization circuit is further configured
to filter the phase noise in a stage subsequent to the D/A converter and precedent to the oscillator.

15. The reference signal generator of claim 2, wherein a sampling cycle for the synchronization circuitry to modulate by oversampling is different from a control cycle of the oscillator.

16. The reference signal generator of claim 15, wherein, the synchronization circuit is further configured
to divide the reference signal outputted from the oscillator, to generate a phase comparison signal, and to output the phase comparison signal,
to detect a phase difference between the reference signal and the phase comparison signal, to generate a phase difference signal, and to output the phase difference signal,
to average the phase difference signal and to output the control signal, and
to modulate the holdover control signal according to the control signal.

17. The reference signal generator of claim 16, wherein, the synchronization circuit is further configured
to filter the phase noise in a stage subsequent to the D/A converter and precedent to the oscillator.

18. The reference signal generator of claim 3, wherein the synchronization circuitry further configured to modulate the holdover control signal with a delta-sigma principle.

19. The reference signal generator of claim 18, wherein a sampling cycle for the synchronization circuitry to modulate by oversampling is different from a control cycle of the oscillator.

20. The reference signal generator of claim 3, wherein a sampling cycle for the synchronization circuitry to modulate by oversampling is different from a control cycle of the oscillator.

* * * * *